(12) United States Patent
Watanabe et al.

(10) Patent No.: US 9,668,387 B2
(45) Date of Patent: May 30, 2017

(54) SHIELD STRUCTURE OF ELECTRONIC DEVICE UNIT AND CONTROL PANEL HOUSING

(71) Applicant: FANUC CORPORATION, Yamanashi (JP)

(72) Inventors: Hitoshi Watanabe, Yamanashi (JP); Kazuyuki Sasaki, Yamanashi (JP); Hideki Okamura, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 30 days.

(21) Appl. No.: 14/722,371

(22) Filed: May 27, 2015

(65) Prior Publication Data
US 2015/0351291 A1   Dec. 3, 2015

(30) Foreign Application Priority Data

May 29, 2014  (JP) ................................ 2014-111677

(51) Int. Cl.
*H05K 9/00* (2006.01)
(52) U.S. Cl.
CPC ......... *H05K 9/0015* (2013.01); *H05K 9/0009* (2013.01); *H05K 9/0049* (2013.01); *H05K 9/0054* (2013.01)
(58) Field of Classification Search
CPC ... H05K 9/0009; H05K 9/0015; H05K 9/0054
See application file for complete search history.

(56) References Cited

U.S. PATENT DOCUMENTS

| 5,170,321 A * | 12/1992 | Oslund ................ H05K 9/0022 174/357 |
| 5,898,127 A * | 4/1999 | Schuhmacher .......... H05K 5/06 174/367 |
| 6,674,653 B1 | 1/2004 | Valentine |
| 2002/0016182 A1* | 2/2002 | Kubo ................... H04M 1/0216 455/575.3 |
| 2006/0098417 A1* | 5/2006 | Yuan .................... H05K 9/0054 361/816 |
| 2009/0141470 A1* | 6/2009 | Hamada ............... H05K 9/0054 361/816 |

(Continued)

FOREIGN PATENT DOCUMENTS

JP    63-124793 U    8/1988
JP    7-326881 A    12/1995

(Continued)

OTHER PUBLICATIONS

Office Action mailed Oct. 6, 2015, corresponding to Japanese Patent Application No. 2014-111677.

*Primary Examiner* — Hung V Ngo
(74) *Attorney, Agent, or Firm* — Hauptman Ham, LLP

(57) ABSTRACT

In an electrical shield structure of an electronic device unit and a control panel housing, a metal frame includes a plurality of protrusions having conductivity and having heights to come into contact with the control panel housing. The plurality of protrusions are provided at positions which surround an electronic component. A packing includes a plurality of holes through which the protrusions are inserted at positions corresponding to the positions of the protrusions.

15 Claims, 8 Drawing Sheets

(56) References Cited

U.S. PATENT DOCUMENTS

| | | | | |
|---|---|---|---|---|
| 2009/0168314 A1* | 7/2009 | Park | ............... | G02F 1/133308 |
| | | | | 361/679.02 |
| 2011/0080721 A1* | 4/2011 | Yukiyoshi | ............... | H04N 5/64 |
| | | | | 361/816 |
| 2014/0078719 A1* | 3/2014 | Jung | ............... | H05K 5/02 |
| | | | | 362/97.1 |
| 2014/0133116 A1* | 5/2014 | Matano | ............... | H05K 1/0213 |
| | | | | 361/760 |
| 2014/0262481 A1* | 9/2014 | Khoury | ............... | H02G 3/14 |
| | | | | 174/480 |

FOREIGN PATENT DOCUMENTS

| | | |
|---|---|---|
| JP | 8-330777 A | 12/1996 |
| JP | 2000-312091 A | 11/2000 |
| JP | 2006-203150 A | 8/2006 |

* cited by examiner

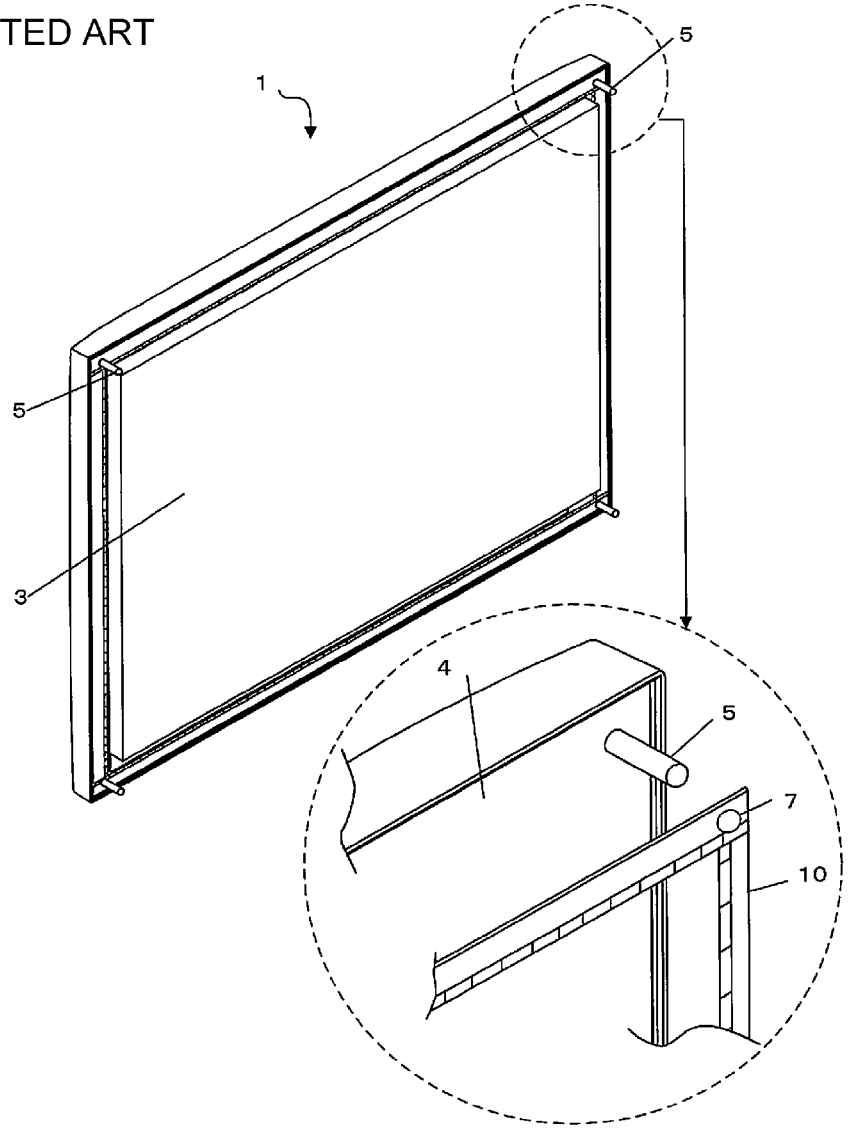

SHIELD STRUCTURE OF ELECTRONIC DEVICE UNIT AND CONTROL PANEL HOUSING

RELATED APPLICATIONS

The present application claims priority to Japanese Application Number 2014-111677, filed May 29, 2014, the disclosure of which is hereby incorporated by reference herein in its entirety.

BACKGROUND OF THE INVENTION

1. Field of the Invention

The present invention relates to an electrical shield structure between an electronic device unit such as a numerical control device and a control panel housing.

2. Description of the Related Art

An electronic device unit which controls a machine tool, such as a numerical control device, is mounted on a control panel housing or the like of the machine tool and is used in a severe factory environment in which a cutting fluid is used. Therefore, the cutting fluid may be directly or indirectly applied to the electronic device unit. Therefore, for the purpose of protecting the inside of the control panel housing from the factory environment, a structure in which a seal member such as a packing is used between the control panel housing and the electronic device unit or in a pull-in port of a cable directed to the inside of the control panel housing so as not to allow outside air or the cutting fluid to infiltrate into the control panel housing is formed.

On the other hand, the electronic device unit needs to maintain noninterference with and resistance (EMC) to electrical noise such as electromagnetic waves, radiation noise, or induction noise, and thus an electrical shield needs to be provided between the control panel housing and the electronic device unit as an EMC countermeasure. In order to allow physical sealability and an electrical shielding effect to be compatible with each other as such, a conductive packing has been hitherto used as the seal member.

FIGS. 7 and 8 are views illustrating the structures of a control panel housing and an electronic device unit of the related art.

As illustrated in FIG. 7, an electronic device unit 1 such as a display unit or an operation panel unit is used in a state of being mounted on a control panel housing 2 in a factory environment. FIG. 8 is a view illustrating the electronic device unit 1 detached from the control panel housing 2 when viewed from the rear side. The electronic device unit 1 is configured by allowing an electronic component such as a display panel or a substrate to be embedded in a metal frame 4. The metal frame 4 is provided with mounting portions 5, for example, at the four corners thereof such that the metal frame 4 can be mounted on the control panel housing 2 by the mounting portions 5. In addition, a conductive packing 10 is attached between the metal frame 4 and the control panel housing 2, and the metal frame 4 is mounted on the control panel housing 2 by allowing the mounting portions 5 to pass through holes 7 provided in the conductive packing 10 such that the gap between the metal frame 4 and the control panel housing 2 is sealed by the conductive packing and thus infiltration of a cutting fluid or the like into the control panel housing 2 is prevented. In addition, the metal frame 4 and the control panel housing 2 come into contact with each other via the conductive packing 10, and thus an electrical shield which electrically shields an electronic component from an outside factory environment is formed.

In addition, as other EMC countermeasures, as described in JP 07-326881 A, a structure in which an electrical shield is obtained by providing predetermined embossed portions (protrusions) is known.

However, the conductive packing is more expensive than a general packing, and thus there is a problem in terms of cost. In addition, an electrical shield structure described in JP 07-326881 A relates to an electrical shield structure of a component in a device. Therefore, a seal member such as a packing which is an insulating material is not disposed between components included in the electrical shield structure. Although such a configuration is simply employed by a machine tool, there is a problem in that physical sealability may not be secured.

SUMMARY OF THE INVENTION

Here, an object of the invention is to provide a structure having both of physical sealability and an electrical shielding effect without using an expensive conductive packing.

According to the invention, there is provided an electrical shield structure of an electronic device unit and a control panel housing, including, in the electronic device unit, an electronic component mounted in a metal frame having a plurality of mounting portions to be mounted on the control panel housing, and the electrical shield structure is configured by mounting the electronic device unit on the control panel housing via a packing, the metal frame includes a plurality of protrusions having conductivity and having heights to come into contact with the control panel housing, and the plurality of protrusions are provided at positions which surround the electronic component, and the packing includes a plurality of holes through which the protrusions are inserted at positions corresponding to the positions of the protrusions.

According to the invention, there is provided an electrical shield structure of an electronic device unit and a control panel housing, including, in the electronic device unit, an electronic component is mounted in a metal frame having a plurality of mounting portions to be mounted on the control panel housing, and the electrical shield structure is configured by mounting the electronic device unit on the control panel housing via a packing, the control panel housing includes a plurality of protrusions having conductivity and having heights to come into contact with the metal frame, and the plurality of protrusions are provided at positions which surround the electronic component, and the packing includes a plurality of holes through which the protrusions are inserted at positions corresponding to the positions of the protrusions.

The heights of the plurality of protrusions may be great at a center portion of the metal frame between the plurality of mounting portions and may be reduced toward the mounting portions.

The heights of the plurality of protrusions may be great in a portion in the control panel housing corresponding to a center portion between the plurality of mounting portions of the metal frame and may be reduced toward portions that oppose the mounting portions.

A bend may be provided in the metal frame in a direction in which a center portion of the metal frame between the plurality of mounting portions is swollen toward a rear surface side of the electronic device unit.

A bend may be provided in the control panel housing in a direction in which a center portion of the control panel housing between the plurality of mounting portions is swollen toward a mounting surface side of the electronic device unit.

Hardnesses of the metal frame and the control panel housing may be different from each other.

Since the invention has the above-described configuration, not an expensive conductive packing but a general packing can be used as a seal member. Therefore, a structure having both of physical sealability and an electrical shielding effect with a reduction in cost can be provided.

BRIEF DESCRIPTION OF THE DRAWINGS

The above and other objects and features of the invention will be more apparent from the following detailed description taken in conjunction with the accompanying drawings in which:

FIG. 8 is a view illustrating the structure of the electronic device unit of the related art.

DETAILED DESCRIPTION OF THE PREFERRED EMBODIMENTS

First Embodiment

Figure 1:
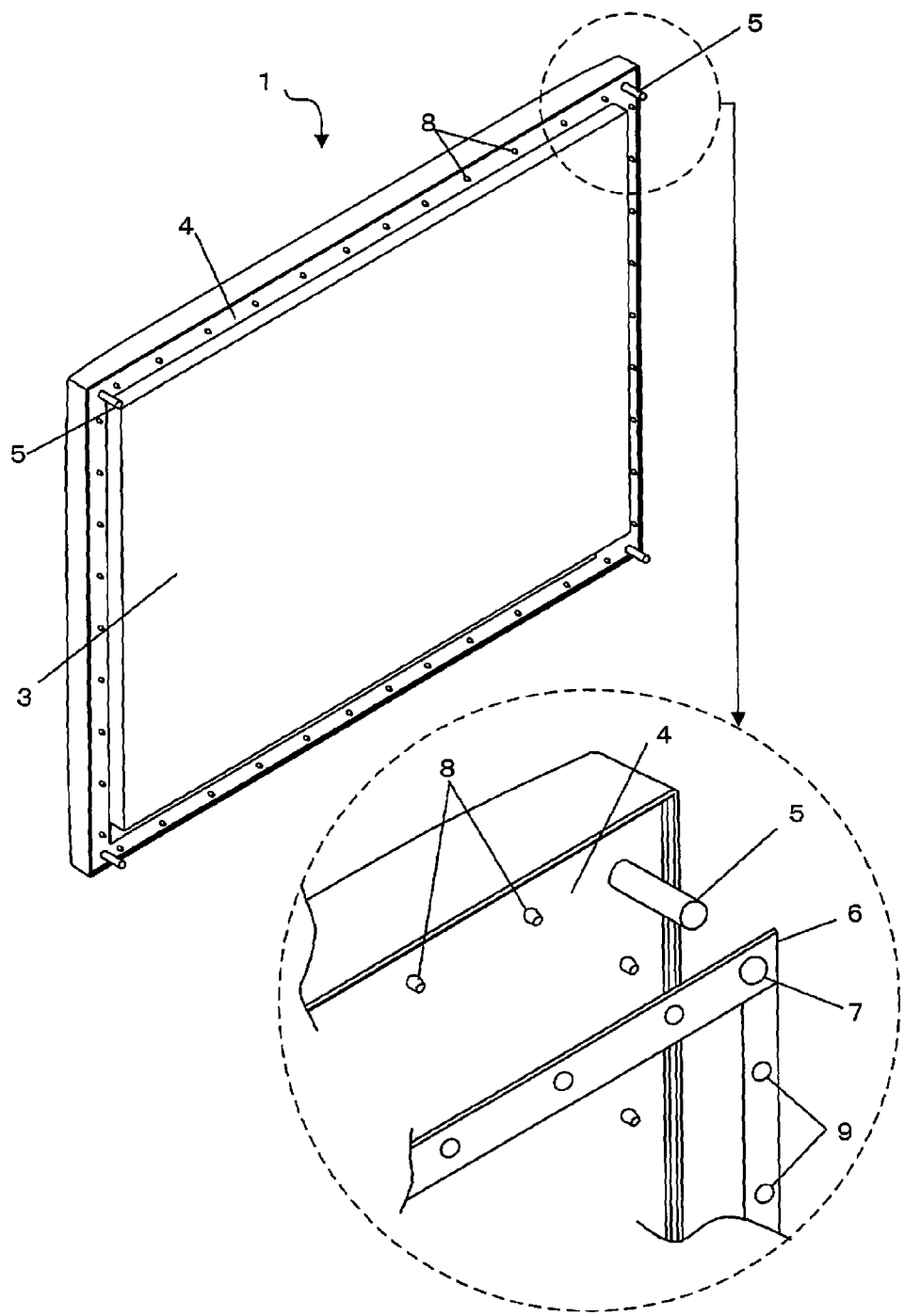
FIG. 1 is a view illustrating an electrical shield structure of a first embodiment of the invention.

FIG. 1 is a view illustrating an electrical shield structure of a first embodiment of the invention.

Figure 7:
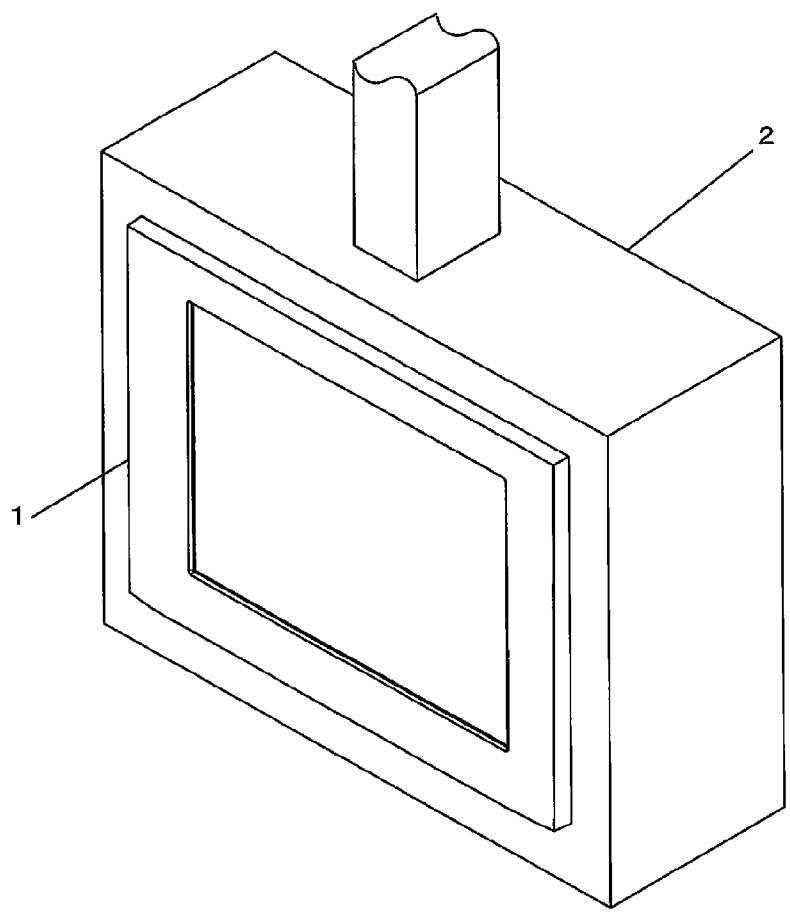
FIG. 7 is a view illustrating the structures a control panel housing and an electronic device unit of the related art.

As illustrated in FIG. 1, an electronic device unit 1 is configured by allowing an electronic component such as a display panel or a substrate to be embedded in a metal frame 4, and is mounted on a control panel housing 2 to be used in a factory environment as in the related art illustrated in FIG. 7. The electronic device unit 1 is mounted on the control panel housing 2, for example, by fixing a plurality of mounting portions 5 which are provided, on the four corners of the metal frame 4, to the control panel housing 2. The mounting portion 5 may be anything which is capable of fixing the metal frame 4 to the control panel housing 2, such as a screw or a nut.

The lower side of FIG. 1 is an enlarged view of a corner portion of the electronic device unit 1.

In the electronic device unit 1 according to this embodiment, a plurality of protrusions 8 are provided at positions which surround an electronic component mounting area 3 in portions which are the rear surface edge portions of the metal frame 4 having an electronic component embedded therein and to which a packing 6 is attached. The protrusion 8 is formed of a material having conductivity, and may be formed by any working method as long as the protrusion 8 is electrically connected to the metal frame 4. For example, the protrusion 8 may be formed by performing embossing on the metal frame 4.

The packing 6 is provided with, in addition to holes 7 through which the mounting portions 5 pass, holes 9 at positions corresponding to the positions of the protrusions 8. When the packing 6 is attached to the metal frame 4, the protrusions 8 pass through the holes 9.

The metal frame 4 configured as described above is mounted on the control panel housing 2 with the packing 6 interposed therebetween by, for example, the mounting portions 5 such as screws. In this case, the packing 6 between the metal frame 4 and the control panel housing 2 is deformed to come into close contact with each of the metal frame 4 and the control panel housing 2, and thus the space surrounded by the metal frame 4 and the control panel housing 2 is physically blocked from the outside, thereby forming a sealed structure which protects inner electronic devices from the infiltration of a cutting fluid or the like. In addition, the protrusions 8 provided in the metal frame 4 come into contact with the control panel housing 2 through the holes 9 provided in the packing 6 and thus electrical conductivity between the metal frame 4 and the control panel housing 2 is secured, thereby forming an electrical shield between the space surrounded by the members and the outside.

In order to allow the protrusions 8 to come into contact with the control panel housing 2 when the metal frame 4 is mounted on the control panel housing 2, the heights of the plurality of protrusions 8 may be set to be slightly smaller than the thickness of the packing 6 in consideration of the amount of compressive deformation of the packing 6.

In addition, regarding the intervals between the plurality of protrusions 8, depending on the frequency of electrical noise emitted from an electronic component embedded in the electronic device unit 1 or the type of electrical noise generated in a factory environment, the protrusions 8 are arranged with intervals therebetween such that an effect of shielding the wavelength of electromagnetic waves to be blocked is sufficiently obtained, and thus a good electrical shielding effect can be obtained depending on the utilization situation of the device.

In this embodiment, since the electrical shielding effect is realized by the structures of the metal frame 4 and the control panel housing 2, an expensive conductive packing does not need to be used as the packing 6, and a general packing can be used.

Second Embodiment

In the first embodiment, the heights of all of the plurality of protrusions 8 are set to be the same. However, in this embodiment, in consideration of the occurrence of deformation or deflection in the metal frame 4 due to the repulsion of the packing 6 attached between the electronic device unit 1 and the control panel housing 2, the heights of protrusions 8 are provided with height differences therebetween corresponding to the amount of deformation or deflection.

Figure 2A:
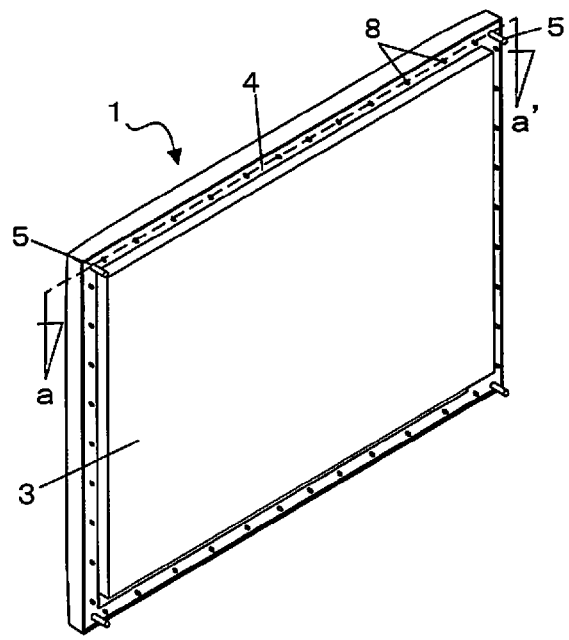
FIGS. 2A and 2B are views illustrating an electrical shield structure of a second embodiment of the invention.
Figure 2B:
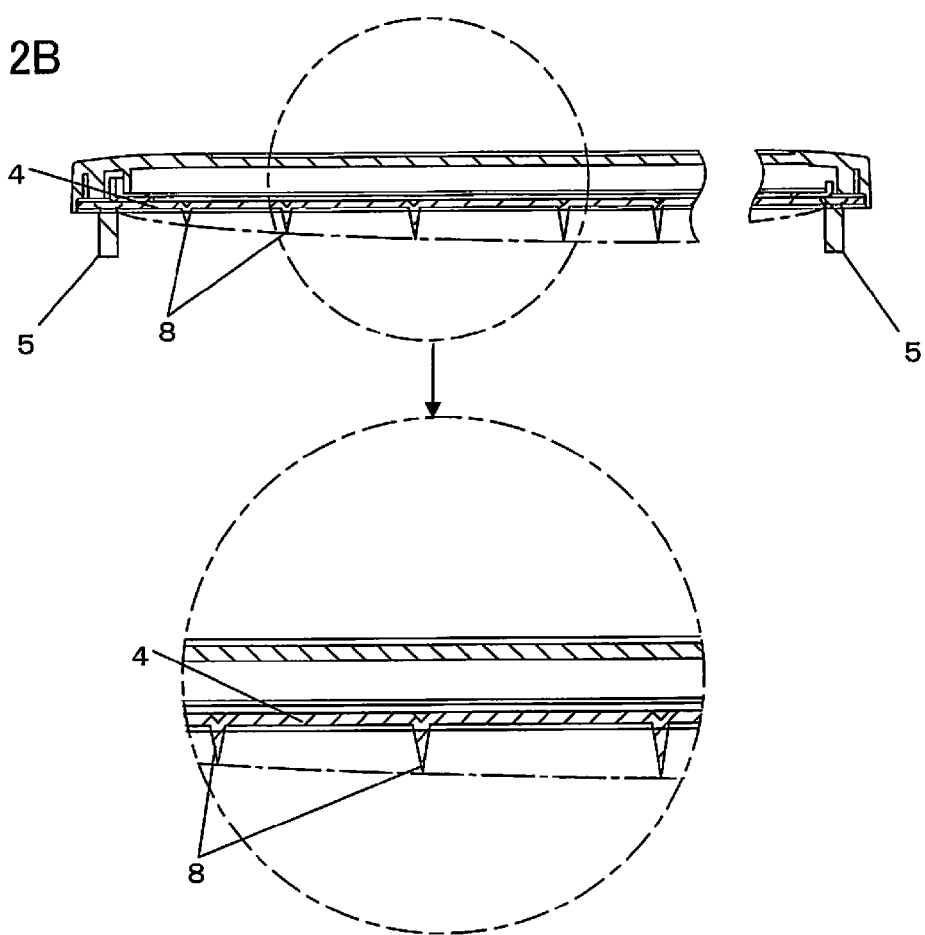

FIG. 2A is a perspective view of the rear surface of the electronic device unit 1 in this embodiment, and FIG. 2B is a cross-sectional view taken along arrow a-a' of FIG. 2A.

In the metal frame 4 included in the electronic device unit 1 in this embodiment, the plurality of protrusions 8 are provided in the same manner as described in the first embodiment, and in consideration of the shapes of the metal frame 4 and the control panel housing 2, the positions of the mounting portions 5 provided in the metal frame 4, the strength of the metal frame 4, the repulsion of the packing 6, and the like, the heights of the protrusions 8 are provided with height differences therebetween corresponding to the amount of deformation or deflection generated in the metal frame 4 when the metal frame 4 is mounted on the control panel housing 2.

For example, as illustrated in FIG. 2A, in a case where the mounting portions 5 are provided at the four corners of the metal frame 4, the metal frame 4 is fixed to the control panel housing 2 by the mounting portions 5, and thus deflection is less likely to occur in the metal frame 4 in the vicinity of the mounting portions 5. However, the metal frame 4 is pressed and deflected in a direction away from the control panel housing 2 due to the repulsion of the packing 6 as it becomes distant from the mounting portions 5. Therefore, when the protrusions 8 are set to have the same height, there is a problem in that the protrusions 8 at the center portion between the mounting portions 5 become separated from the control panel housing 2.

Here, as illustrated in FIG. 2B, in a case where the heights of the protrusions 8 are set to be large at the center potions between the mounting portions 5 and are set to be reduced toward the mounting portions 5, even though deflection occurs in the entire metal frame 4 due to the repulsion of the packing 6 when the metal frame 4 is mounted on the control panel housing 2 via the mounting portions 5, since the heights of the protrusions 8 are set to follow the deflection, the protrusions 8 come into contact with the control panel housing 2 without gaps so as not to be separated from the control panel housing 2. Therefore, an electrical shield which exhibits a good electrical shielding effect can be formed.

In addition, in FIG. 2B, the height differences are emphasized for easy understanding of the configuration of the protrusions. However, in practice, appropriate height differences corresponding to the amount of deformation or deflection generated in the metal frame 4 may be provided.

Third Embodiment

This embodiment is a modification example of the second embodiment. In the second embodiment, the deformation or deflection generated in the metal frame 4 is absorbed by providing the height differences in the protrusions 8. However, in this embodiment, the protrusions 8 are formed to have the same height and a bend corresponding to the amount of deformation or deflection is provided in the metal frame 4 in advance in consideration of the shapes of the metal frame 4 and the control panel housing 2, the positions of the mounting portions 5 provided in the metal frame 4, the strength of the packing 6, and the like such that a structure in which the protrusions 8 of the metal frame 4 are brought into contact with the control panel housing 2 without gaps is provided.

Figure 3:
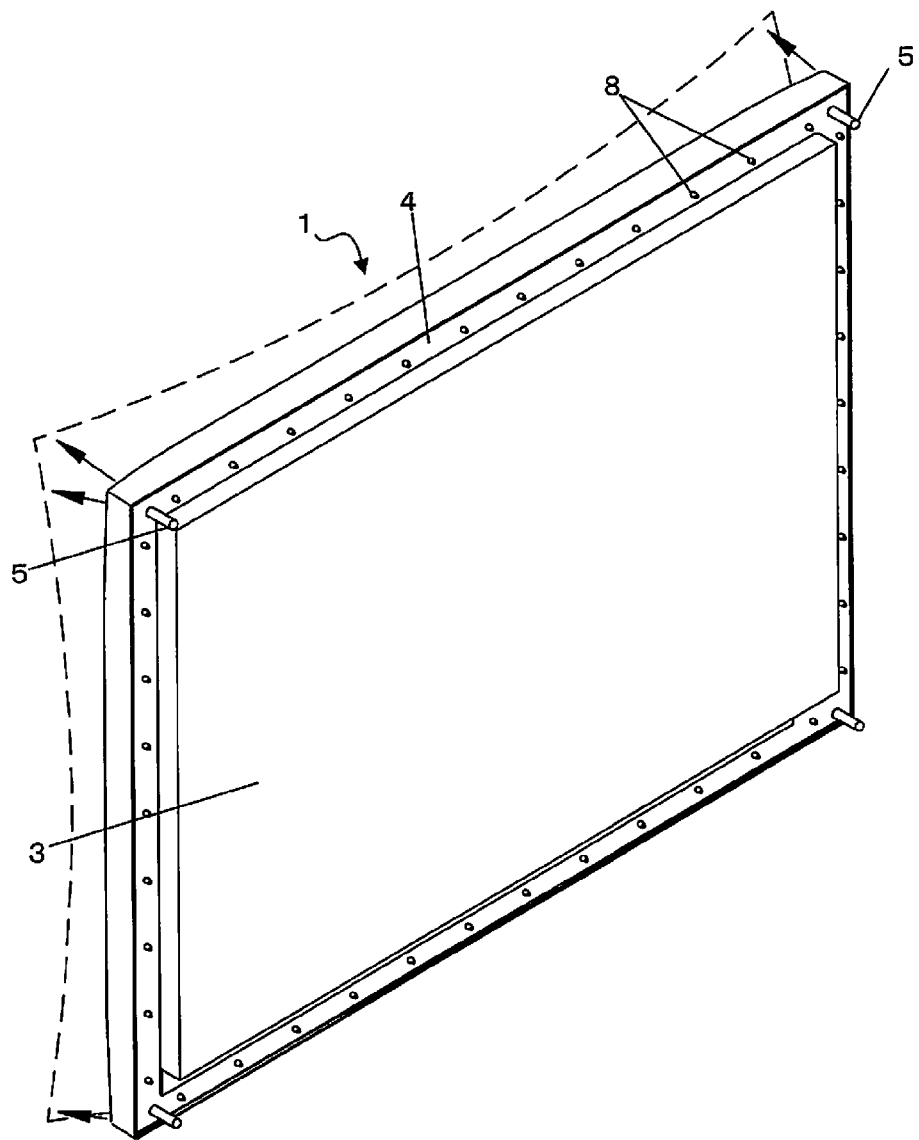
FIG. 3 is a view illustrating an electrical shield structure of a third embodiment of the invention.

FIG. 3 is a view illustrating an electrical shield structure of the third embodiment of the invention.

For example, as illustrated in FIG. 3, a bend is provided in the metal frame 4 in a direction in which the center portion between the plurality of mounting portions 5 provided for mounting the metal frame 4 on the control panel housing 2 is swollen toward the rear surface side of the electronic device unit 1. In other words, the bend is provided in a direction in which the portions where the mounting portions 5 of the metal frame 4 are provided are bent toward the surface of the electronic device unit 1 (the direction of the arrows in FIG. 3). Since the structure is employed, when the metal frame 4 is mounted on the control panel housing 2 via the mounting portions 5, the four corners of the metal frame 4 are deflected toward the control panel housing 2 side, and the heights of the protrusions 8 become parallel to the control panel housing 2. Therefore, the protrusions 8 come into contact with the control panel housing 2 without gaps so as not to become separated from the control panel housing 2, and an electrical shield which exhibits a good electrical shielding effect can be formed.

Fourth Embodiment

In this embodiment, the metal frame 4 and the control panel housing 2 use materials having different hardnesses, and a structure in which the soft material is crushed to allow the metal frame 4 and the control panel housing 2 to reliably come into contact with each other is provided.

Figure 4:
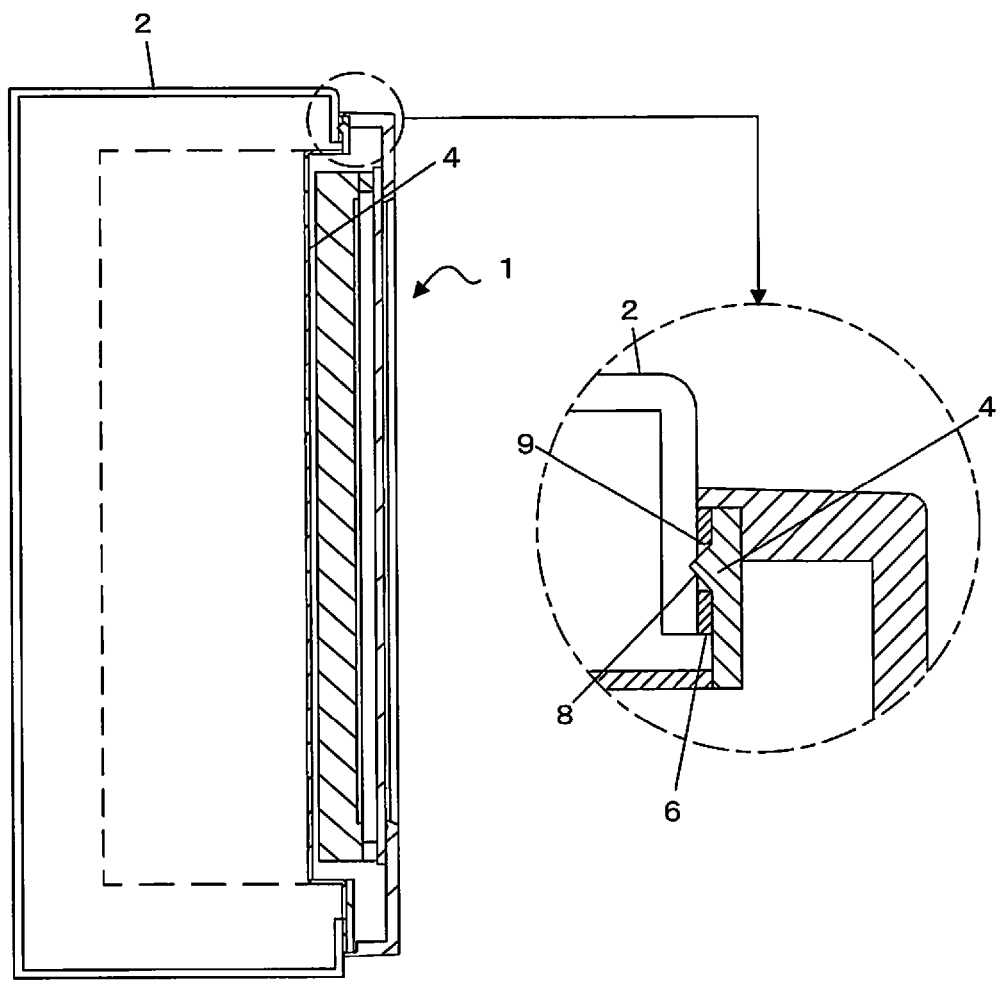
FIG. 4 is a view illustrating an example of an electrical shield structure of a fourth embodiment of the invention.

FIG. 4 is a view illustrating an electrical shield structure in a case where the hardness of the metal frame 4 is greater than the hardness of the control panel housing 2. As illustrated in FIG. 4, when the metal frame 4 is mounted on the control panel housing 2, the protrusions 8 provided in the metal frame 4 are pressed against the control panel housing 2 via the holes 9 provided in the packing 6. However, since the protrusions 8 and the metal frame 4 have the same hardness which is greater than the hardness of the control panel housing 2, the protrusions 8 come into contact with the control panel housing 2 which is softer in a form of biting thereinto.

Figure 5:
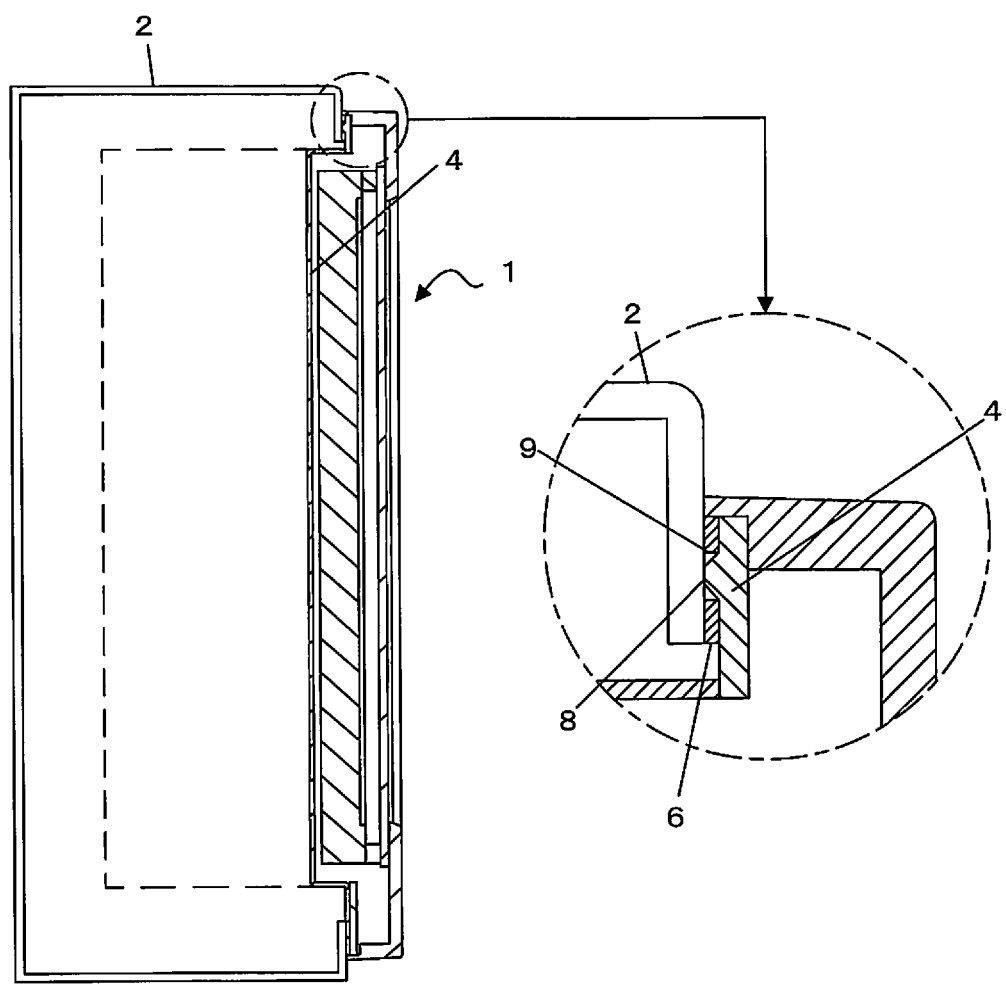
FIG. 5 is a view illustrating an example of the electrical shield structure of the fourth embodiment of the invention.

On the other hand, FIG. 5 is a view illustrating an electrical shield structure in a case where the hardness of the metal frame 4 is smaller than the hardness of the control panel housing 2. As illustrated in FIG. 5, when the metal frame 4 is mounted on the control panel housing 2, the protrusions 8 provided in the metal frame 4 are pressed against the control panel housing 2 via the holes 9 provided in the packing 6. However, since the protrusions 8 and the metal frame 4 have the same hardness which is smaller than the hardness of the control panel housing 2, the protrusions 8 come into contact with the control panel housing 2 in a form of being crushed due to the hardness difference therebetween.

Another Embodiment

In the first to fourth embodiments, the protrusions 8 are provided on the electronic device unit 1 side. However, even when the protrusions 8 for obtaining an electrical shield are not provided on the electronic device unit 1 side but are provided on the control panel housing 2 side and the metal frame 4 has a smooth surface in the periphery of the electronic device unit, the same effects as those of the other embodiments can be obtained.

In addition, in the third embodiment, the bend corresponding to the amount of deformation or deflection is provided in the metal frame 4 in advance. However, in a case where the protrusions are provided on the control panel housing 2 side, a bend corresponding to the amount of deformation or deflection may be provided on the control panel housing 2 side in advance.

Figure 6:
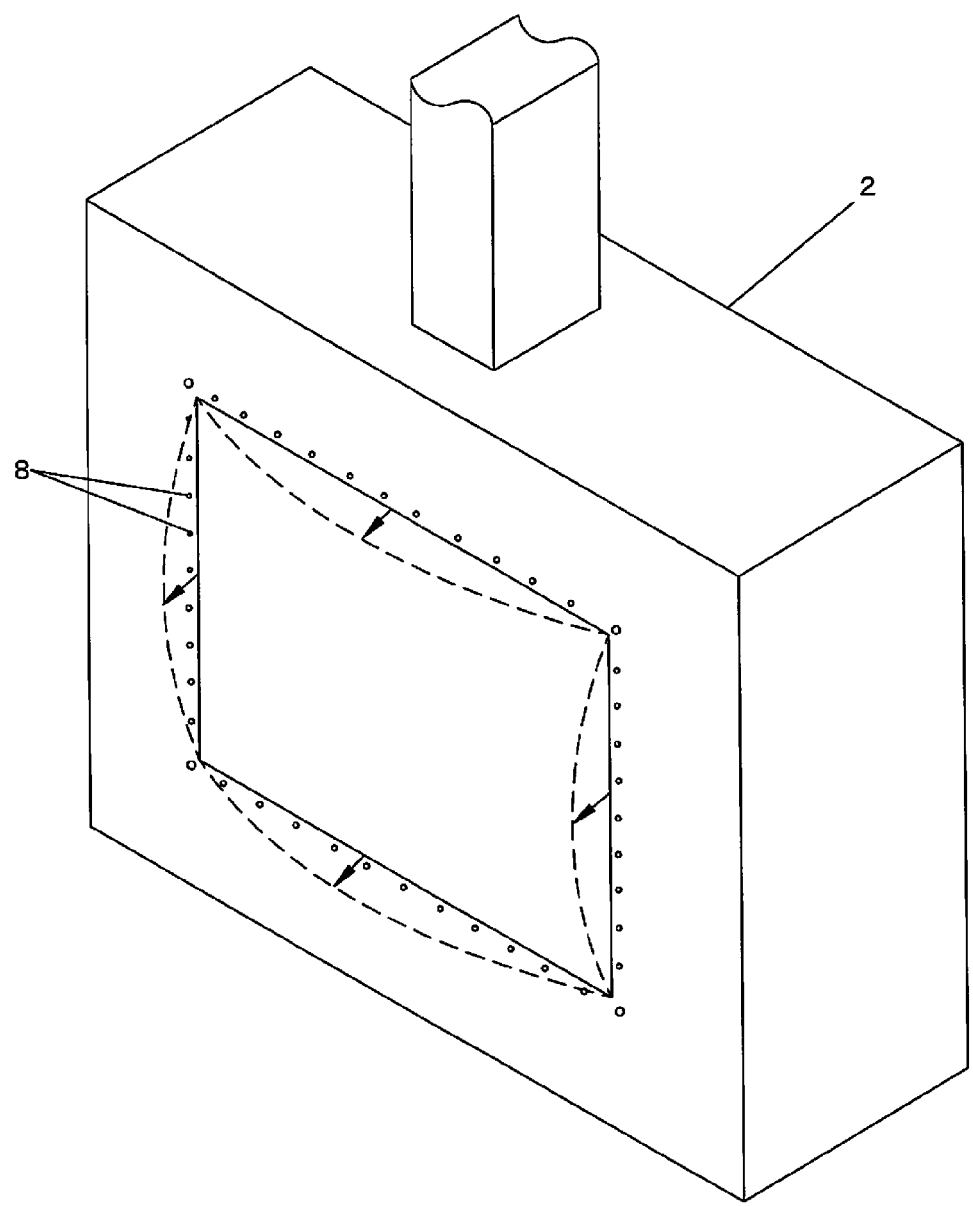
FIG. 6 is a view illustrating an electrical shield structure of another embodiment of the invention.

In FIG. 6, a bend is provided in the control panel housing 2 provided with the protrusions 8 in a direction in which the center portion of the control panel housing 2 positioned between the plurality of mounting portions 5 is swollen toward the mounting surface side of the metal frame 4 when the metal frame 4 is mounted. According to this structure, when the metal frame 4 is mounted on the control panel housing 2 via the mounting portions 5, the metal frame 4 is deflected along the bend provided in the control panel housing 2 and thus the protrusions 8 come into contact with the control panel housing 2 without gaps so as not to become separated from the control panel housing 2 such that an electrical shield which exhibits a good electrical shielding effect can be formed.

The invention claimed is:

1. An electrical shield structure of an electronic device unit and a control panel housing, including, in the electronic device unit, an electronic component mounted in a metal frame having a plurality of mounting portions to be mounted on the control panel housing, and the electrical shield structure is configured by mounting the electronic device unit on the control panel housing via a packing, the metal frame includes:
   a plurality of protrusions having conductivity and having heights to come into contact with the control panel housing, and the plurality of protrusions are provided at positions which surround the electronic component, and
   the packing includes a plurality of holes through which the protrusions are inserted at positions corresponding to the positions of the protrusions.

2. The electrical shield structure according to claim 1, wherein the heights of the plurality of protrusions in the thickness direction of the metal frame are reduced from a center portion of the metal frame between the plurality of mounting portions toward the plurality of mounting portions.

3. The electrical shield structure according to claim 1, wherein a bend is provided in the metal frame in a direction in which a center portion of the metal frame between the plurality of mounting portions is swollen toward a rear surface side of the electronic device unit.

4. The electrical shield structure according to claim 1, wherein hardnesses of the metal frame and the control panel housing are different from each other.

5. The electrical shield structure according to claim 1, wherein, among the plurality of protrusions, the height of a protrusion at a center portion of the metal frame between the plurality of mounting portions is higher than the height of another protrusion located farther away from the center portion.

6. The electrical shield structure according to claim 1, wherein the plurality of protrusions is arranged with intervals configured to obtain an effect of shielding a wavelength of electromagnetic waves to be blocked.

7. The electrical shield structure according to claim 1, wherein a hardness of the metal frame is greater than a hardness of the control panel housing.

8. The electrical shield structure according to claim 1, wherein a hardness of the metal frame is smaller than a hardness of the control panel housing.

9. An electrical shield structure of an electronic device unit and a control panel housing, including, in the electronic device unit, an electronic component mounted in a metal frame having a plurality of mounting portions to be mounted on the control panel housing, and the electrical shield structure is configured by mounting the electronic device unit on the control panel housing via a packing, the control panel housing includes:
   a plurality of protrusions having conductivity and having heights to come into contact with the metal frame, and the plurality of protrusions are provided at positions which surround the electronic component, and
   the packing includes a plurality of holes through which the protrusions are inserted at positions corresponding to the positions of the protrusions.

10. The electrical shield structure according to claim 9, wherein the heights of the plurality of protrusions in the thickness direction of the metal frame are reduced from a portion in the control panel housing corresponding to a center portion between the plurality of mounting portions of the metal frame toward portions that oppose the plurality of mounting portions.

11. The electrical shield structure according to claim 9, wherein a bend is provided in the control panel housing in a direction in which a center portion of the control panel housing between the plurality of mounting portions is swollen toward a mounting surface side of the electronic device unit.

12. The electrical shield structure according to claim 9, wherein, among the plurality of protrusions, the height of a protrusion at a center portion of the metal frame between the plurality of mounting portions is higher than the height of another protrusion located farther away from the center portion.

13. The electrical shield structure according to claim 9, wherein the plurality of protrusions is arranged with intervals configured to obtain an effect of shielding a wavelength of electromagnetic waves to be blocked.

14. The electrical shield structure according to claim 9, wherein a hardness of the metal frame is greater than a hardness of the control panel housing.

15. The electrical shield structure according to claim 9, wherein a hardness of the metal frame is smaller than a hardness of the control panel housing.

* * * * *